(12) United States Patent
Poret et al.

(10) Patent No.: US 11,515,804 B2
(45) Date of Patent: Nov. 29, 2022

(54) ELECTRICAL POWER CIRCUIT FOR AN ELECTRICAL POWER CONVERTER

(71) Applicants: SAFRAN ELECTRICAL & POWER, Blagnac (FR); ELVIA PRINTED CIRCUIT BOARDS, Coutances (FR)

(72) Inventors: Philippe Poret, Blagnac (FR); Olivier Belnoue, Ondreville sur Essonne (FR)

(73) Assignees: SAFRAN ELECTRICAL & POWER, Blagnac (FR); ELVIA PRINTED CIRCUIT BOARDS, Coutances (FR)

( * ) Notice: Subject to any disclaimer, the term of this patent is extended or adjusted under 35 U.S.C. 154(b) by 121 days.

(21) Appl. No.: 17/266,418

(22) PCT Filed: Aug. 6, 2019

(86) PCT No.: PCT/FR2019/051909
§ 371 (c)(1),
(2) Date: Feb. 5, 2021

(87) PCT Pub. No.: WO2020/030876
PCT Pub. Date: Feb. 13, 2020

(65) Prior Publication Data
US 2021/0297003 A1    Sep. 23, 2021

(30) Foreign Application Priority Data
Aug. 7, 2018  (FR) ...................... 1857356

(51) Int. Cl.
*H05K 7/20* (2006.01)
*H02M 7/00* (2006.01)
(Continued)

(52) U.S. Cl.
CPC .......... *H02M 7/003* (2013.01); *H05K 1/0298* (2013.01); *H05K 3/46* (2013.01); *H05K 7/2089* (2013.01)

(58) Field of Classification Search
CPC ....... H05K 1/0298; H05K 3/46; H05K 7/2089
(Continued)

(56) References Cited

U.S. PATENT DOCUMENTS

2009/0002950 A1*  1/2009  Gertiser ................. H05K 7/205
361/709

FOREIGN PATENT DOCUMENTS

WO    2017144599 A1    8/2017

OTHER PUBLICATIONS

French Search Report in FR Application No. 1857356, dated Mar. 28, 2019, (2 pages).
(Continued)

*Primary Examiner* — Sherman Ng
(74) *Attorney, Agent, or Firm* — Bookoff McAndrews, PLLC.

(57) ABSTRACT

An electric circuit for a power converter having a substrate having a first face on which electronic components are mounted and a second face intended to cooperate with a cooling system, the substrate having a stack of conductive layers made of electrically and thermally conductive material and at least one insulating layer made of electrically insulating material, two successive conductive layers being separated by an insulating layer, and the conductive and insulating layers extending in parallel planes and being mechanically associated together. Each conductive layer has two opposite faces parallel to the plane in which the first face of the substrate extends and includes, on at least one of its two faces, at least one boss extending in a direction perpendicular to the plane, the at least one boss passing through at least one other conductive layer and opening out onto the first or the second face of the substrate.

11 Claims, 2 Drawing Sheets

(51) Int. Cl.
*H05K 1/02* (2006.01)
*H05K 3/46* (2006.01)

(58) Field of Classification Search
USPC .......................................................... 361/688
See application file for complete search history.

(56) References Cited

OTHER PUBLICATIONS

International Search Report issued in International Application No. PCT/FR2019/051909, dated Nov. 7, 2019 (2 pages).

\* cited by examiner

ELECTRICAL POWER CIRCUIT FOR AN ELECTRICAL POWER CONVERTER

CROSS-REFERENCE TO RELATED APPLICATION(S)

This application is the U.S. national phase entry under 35 U.S.C. § 371 of International Application No. PCT/FR2019/051909, filed on Aug. 6, 2019, which claims priority to French Patent Application No. 1857356, filed on Aug. 7, 2018.

BACKGROUND OF THE INVENTION

The invention relates to an electric power circuit for a power converter, and more particularly to the manufacture of a substrate for an electric power circuit of a power converter of a rotating machine control unit, for example for monitoring actuators, AC/DC or DC/DC converters, fans or propulsion machines.

In the power conversion systems generally used for controlling rotating machines or converters, the power electronics used for controlling the machine are in the form of a unit located either in a bay grouping together several of these units or, autonomously, in the environment of the controlled machine.

The use and optimization of the power components require optimal heat transfer and reduction in the parasitic inductance. The integration of the power electronics as close as possible to the windings of the machine allows an optimization in terms of volume, cooling and performance of the entire electric chain.

In general, this control unit groups together a system for filtering the supply voltage, a power converter consisting mainly of power switches controlled according to predefined control laws, a cooling system and, in the case where the converter is remote from the machine it monitors, an output filtering system.

The supply voltage filtering system allows reducing the disturbances emitted by the control electronics and circulating on the supply lines. The possible output filtering system allows reducing the disturbances created by the converter upon switching the power switches. And, the cooling system allows discharging the calories dissipated by the electronics either into the air or through an exchange with a coolant. The cooling system also ensures that the maximum allowable temperatures at the junction of the semiconductors used in the power converter are not exceeded.

The power switches of the power converter are generally, in a first configuration intended in particular for converters of a few kilowatts, in the form of discrete components mounted on a support of the printed circuit type or, in a second configuration intended in particular for higher powers, in the form of power modules consisting mainly of bare chips soldered on a support allowing several chips to be interconnected, the whole being protected in a unit constituting the module itself.

In the second configuration, a standard power module is in the form of a block of rectangular format which integrates the different electrical connections both for the power portion and for the low-level signals used to monitor the power components integrated inside the module.

In this second configuration, a power module consists, in general, of a base on which a substrate is transferred by means of an adhesive, or by means of an alloy delivered during a soldering operation, or by means of the sintering of silver nanoparticles. The substrate generally consists of ceramic on which are deposited aluminum or copper conductors by Direct Bonding Copper (DBC) for copper conductors, or by Direct Bonding Aluminum (DBA) for aluminum conductors.

The substrate serves as a support for the power components which are then in the form of bare chips which are themselves either bonded by means of an adhesive, or soldered by means of an alloy delivery, or sintered by means of the delivery of silver nanoparticles. The power components are connected together and towards the outer connections of the module by means of bond wires, generally consisting of aluminum, copper or gold, both for the power connections and for the control signals to control the power components.

In some variants of the second configuration, the power module does not have a base in order to allow more efficient heat conduction by avoiding the thermal interface inherent in the bonding between the substrate and the base of the module.

The power switches produced according to the second configuration, i.e. using integrated modules, require for each new application the development of a substrate, or even a base, specific by the substrate manufacturer inducing a level of higher development cost that does not allow achieving a low recurring cost in the case where the quantities of modules to be produced remain low, as in the case of an aeronautical application.

The stacking of the different layers necessary for the production of the module which consists of a base, a substrate and chips as well as the materials necessary for the assembly of these different layers induce a significant thermal resistance because of the different thermal interfaces specific to the assembly and to the insulating materials involved in this assembly.

The thermal interface necessary to allow a good thermal bonding between the module and the thermal management system can also bring either constraints during the production assembly phases, or limitations in the lifetime of the assembly, for example in presence of high humidity, which can lead to drifts in the electrical properties of the interface in the case where the latter contributes to the insulation between the power components and the thermal management system.

In the first configuration used to make a power core, discrete components are soldered on a printed circuit.

In the case where the components are of the through type, they must be mechanically fixed to the thermal management system through a thermal interface which must also ensure the electrical insulation between the component and the thermal management system in the case where the electrical potential of the latter is different from that of the power component.

In the case where the power components used are of the "surface mounted" type, it is possible to improve the heat transfer to the vertical of the component by using parts of copper or other materials having a low thermal resistance while ensuring a relative low expansion of the facing materials. Said parts are inserted into the structure of the printed circuit and thus reduce the distance between the rear face of the power component and the surface of the thermal management system.

In the two cases described above for the first configuration, i.e. the case of through components and the case of surface-mounted components, the use of a printed circuit implies a limitation of the currents flowing through the copper tracks of the printed circuit due to the section of copper used for the passage of current, this section depending itself on the maximum thickness of copper that can be used to make the assembly of the printed circuit layers.

The power switches produced according to the first configuration are much more versatile than those of the type according to the second one and do not require much effort in terms of development cost.

The main drawback of the switches according to the first configuration is the current limitation related to the maximum thickness of copper used for the production of the printed circuit. The maximum thickness generally used in printed circuits is of about 400 µm, whereas the standard copper thickness in a printed circuit is of 35 µm.

In addition, the thermal interface required for the implantation of the power component on its thermal management system generates, similarly to the second configuration, constraints both on the industrial level and on the assembly reliability and durability level.

OBJECT AND SUMMARY OF THE INVENTION

The invention aims at providing an electric power circuit of an electric power converter for a control unit controlling at least one rotating machine whose characteristics of heat transfer between the power components and the heat dissipation system and electrical characteristics related to the parasitic inductances are optimized in a small space requirement, the electric circuit being able to be used for any electric power to be converted.

In a first object of the invention, there is proposed an electric power circuit comprising a substrate having a first face on which electronic power components are mounted and a second face opposite to the first face and intended to cooperate with a cooling system.

According to a general characteristic of the first object of the invention, the substrate comprises a stack of a plurality of conductive layers made of electrically and thermally conductive material and at least one insulating layer made of electrically insulating material, two successive conductive layers in the stack being separated by an insulating layer, and said conductive and insulating layers extending in planes parallel to the plane in which the first face of the substrate extends and being mechanically associated together. Each conductive layer has two opposite faces parallel to the plane in which the first face of the substrate extends and includes, on at least one of its two faces, at least one boss extending in a direction perpendicular to the plane in which the first face of the substrate extends, said at least one boss passing through at least one other conductive layer and opening out onto the first or the second face of the substrate.

The first object of the invention thus provides a power circuit provided with a substrate for power components formed by the superimposition of two to N layers, or plates, of an electrically and thermally conductive material such as copper or one of its alloys or aluminum or one of its alloys. The layers are associated together and can have a thickness of a few tenths of millimeters to a few millimeters depending on the electric intensity intended to travel through said conductive layer. Each conductive layer is embossed, i.e., it has bosses that will be used either to implant power components or to create heat sinks under the conductive layer depending on their location in the stack. Some layers have holes allowing the passage of the bosses of the other plates. The conductive layers are nested and laminated together by using sheets of insulating material that can themselves have embossments allowing, by interlocking between the bosses, the insulation of the conductive layers.

Electronic power components, such as bare chips or discrete components, can be assembled on the upper face of the assembly forming the substrate by means of an adhesive, or by means of an alloy delivered during a soldering operation, or by means of sintering of silver nanoparticles.

In the case for example of an inverter arm, the use of a power circuit provided with a stack of conductive plates mechanically assembled together allows reducing the thermal resistance of the converter and obtaining a substrate having a low thermal resistance similar for all the used power components.

An electric power converter with such a substrate can further be used for all the electric powers, the intensity of the currents being able to pass through the substrate depending on the thickness of the conductive plates used for the assembly.

In addition, according to the thickness of the conductive plates, it is possible to include power connections directly in the copper plates allowing for example a direct assembly of the screw-nut type of cables, supply bars or connections towards the supplied loads.

Such a converter also allows reducing the parasitic inductance related to the supply loop created between the supply polarities and the power components. This parasitic inductance reduction is obtained through the use of parallel planes for the electrical connection towards the two supply polarities of the inverter arm.

The electric power circuit according to the first object of the invention also allows integration, as close as possible to power components, of the components necessary for their control by integrating for example on the upper face of the assembly, i.e. the first face of the substrate, areas allowing directly including low-level components.

Preferably, the conductive layers are plates of conductive material such as copper plates.

According to the configurations, a conductive layer may comprise first bosses extending from a first face of the layer and second bosses extending from a second face of the layer.

In one embodiment, the upper and lower conductive layers of the substrate have bosses on only one of their faces, and the intermediate conductive layers, in the case where the stack is formed of a number N of conductive layers greater than two, have bosses on both of their faces with varying thicknesses depending on their location in the stack.

An insulating layer having crossings by the bosses is disposed between two consecutive conductive layers of the stack, which allows electrically insulating the potential of each conductive layer during the assembly.

This insulator can itself integrate a printed circuit structure. This insulator will be manufactured with and like a printed circuit structure with the materials of typical use (FR4, etc.) and layers of printed circuit copper with standard thickness (17, 35 µm). The insulating layer inserted between the two layers may itself consist of a stacking of insulating layers and conductive layers, with low thickness such as for example a thin printed circuit consisting of two insulating layers with a thickness for example of 100 µm between each of which an etched conductive layer of 35 µm is inserted, the whole produced as an independent unitary printed circuit.

The upper face of the upper conductive layer of the substrate can form the first face of the substrate and integrate a conventional printed circuit structure thus allowing accommodating components for the monitoring of the power components assembled on the different bosses.

The upper face of the upper conductive layer of the substrate can also allow implanting electronic functions such as a current measuring sensor by using conventional methods for metallization between the different conductive layers used for making the assembly at the different insulators used for the assembly of the layers.

According to a first aspect of the electric power circuit, said at least one boss of a conductive layer can be made in one piece with the conductive layer from which it extends.

According to a second aspect of the electric power circuit, said at least one boss of a conductive layer can be transferred and fixed on the conductive layer from which it extends.

In one variant, said at least one boss of a conductive layer may be an electrically conductive part forcibly inserted into an opening of the conductive layer of said boss thus forming, in the direction perpendicular to the plane in which the first face extends, a first boss extending from the first face and a second boss extending from the second face of the substrate.

In a second object of the invention, there is proposed a control unit comprising a system for filtering a supply voltage, an electric power converter and a system for cooling the calories dissipated by the electronic components of the unit.

According to a general characteristic of the second object, the electric power converter comprises a power circuit as defined above, the second face of the circuit substrate being in thermal contact with said cooling system.

In a third object of the invention, there is proposed a method for manufacturing an electric power circuit for an electric power converter, the circuit comprising a substrate having a first face on which electronic power components are mounted and a second face opposite to the first face and intended to cooperate with a cooling system.

According to a general characteristic of the third object, the method comprises:
  a step of producing at least two conductive layers made of electrically and thermally conductive material,
  a step of producing at least one insulating layer made of electrically insulating material,
  a step of forming a stack of at least two conductive layers and at least one insulating layer, two successive conductive layers in the stack being separated by an insulating layer, and said conductive and insulating layers extending in planes parallel to the plane in which the first face of the substrate extends and being mechanically associated together, and
  a mechanical securing step to mechanically assemble together said conductive and insulating layers,
each conductive layer having two opposite faces parallel to the plane in which the first face of the substrate extends and including, on at least one of its two faces, at least one boss extending in a direction perpendicular to the plane in which the first face of the substrate extends, said at least one boss passing through at least one other conductive layer and opening out onto the first or the second face of the substrate.

According to a first aspect of the manufacturing method, the step of producing at least two conductive layers may comprise, for each conductive layer, a mechanical or chemical machining of a plate of electrically and thermally conductive material whose thickness before machining is at least equal to the sum of the thickness of the layer after machining with the dimension of the largest boss extending from a first face of said conductive layer and, if the conductive layer comprises bosses on two opposite faces, with the dimension of the largest boss extending from a second face of said conductive layer opposite to said first layer.

The bosses can thus be made by mechanically or chemically machining a thicker copper plate in order to obtain the embossments necessary for the interleaving of the different layers.

According to a second aspect of the manufacturing method, the step of producing at least two conductive layers may comprise a formation of said at least one boss by stamping or machining of parts made of electrically and thermally conductive material then a transfer of said at least one boss thus formed on a plate of electrically and thermally conductive material to obtain a conductive layer provided with bosses.

The bosses can thus be made by using parts with the shape and height corresponding to the various bosses to be created on the copper plates. These parts can be obtained either by stamping or by machining. These parts are then transferred to the copper plates and are either bonded by means of an adhesive allowing both thermal and electrical transfer, or soldered by means of an alloy delivery, or sintered by means of the delivery of silver nanoparticles.

One of the advantages of this method is that it is possible to use materials that allow obtaining expansion coefficients close to those of the constituent materials of the bare chip of the power component transferred on the boss. For example, materials such as copper or aluminum alloys coated with any material allowing the transfer of an electronic component can be used.

In the second aspect of the manufacturing method, the transfer of said at least one boss may include a bonding of said boss using an electrically and thermally conductive adhesive, or a soldering of said boss by means of an alloy delivery, or a sintering of said boss by means of a delivery of silver nanoparticles.

According to a third aspect of the manufacturing method, the step of producing at least two conductive layers can comprise a production of each conductive layer provided with bosses in a one piece by additive manufacturing.

According to a fourth aspect of the manufacturing method, the mechanical securing step can comprise a bonding of said conductive and insulating layers or a prepreg lamination of said conductive and insulating layers.

The prepreg is a basic material for manufacturing printed circuits. The prepreg is a fiberglass-based material impregnated with epoxy resin or the like in an uncured state and used for the production of printed circuits by stacking.

In case it is desired to reduce the insulation distances, in the plane in which the conductive and insulating layers extend, between the different electrical potentials, a 3D structuration of the insulator can be used. This 3D structure can be made by machining or by assembly through bonding or by additive manufacturing.

BRIEF DESCRIPTION OF THE DRAWINGS

The invention will be better understood upon reading the following, by way of indication but without limitation, with reference to the appended drawings in which.

DETAILED DESCRIPTION OF EMBODIMENTS

Figure 1:
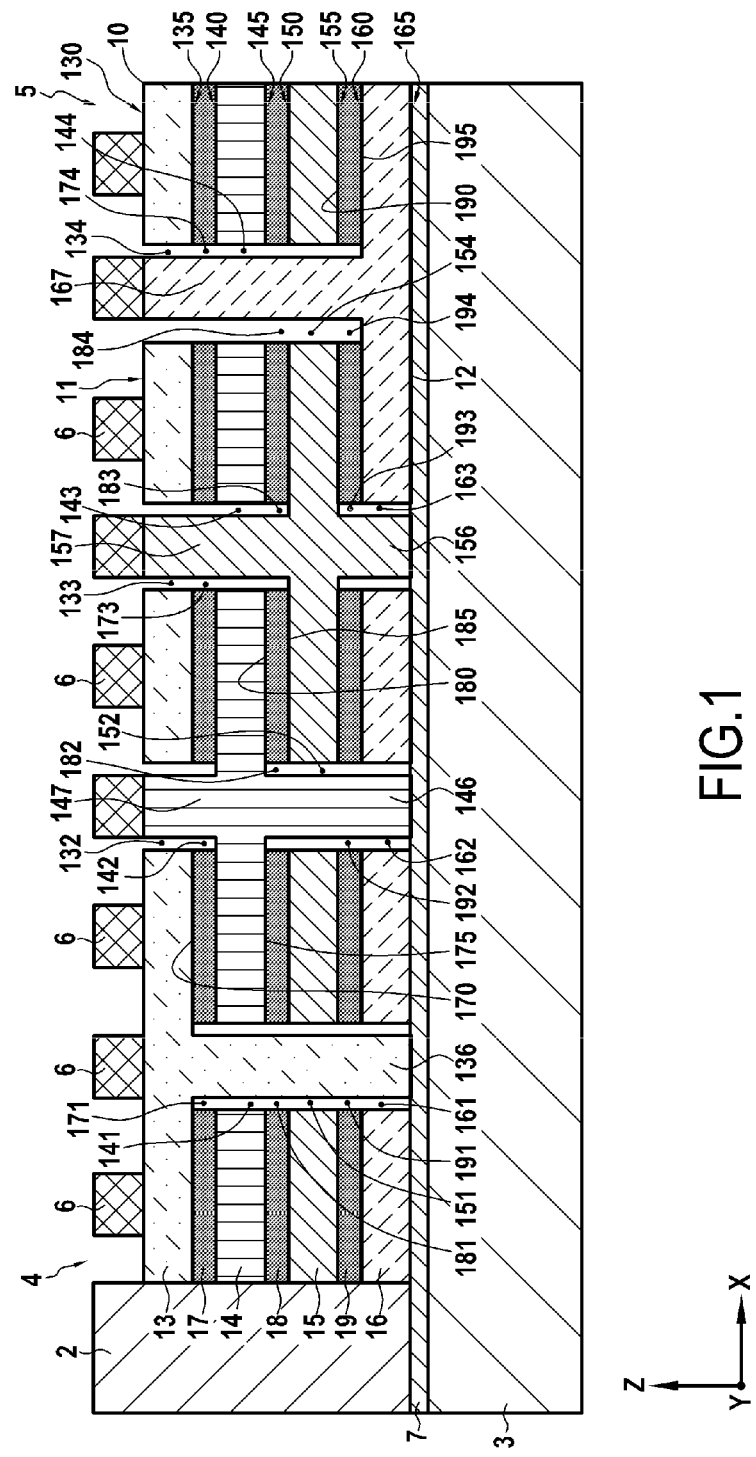
FIG. 1 represents a schematic representation of a control unit comprising an electric power converter provided with an electric power circuit according to one embodiment of the invention.

FIG. 1 illustrates a schematic representation of a control unit 1 comprising an electric power converter 4 provided with an electric power circuit 5 according to one embodiment of the invention.

The control unit 1 comprises a system for filtering a supply voltage 2, a system for cooling 3 the calories dissipated by the electronic components of the unit 1 and an electric power converter 4.

The electric power converter 4 comprises an electric power circuit 5 including a substrate 10 and electronic components 6.

The substrate 10 comprises a first face 11 on which the electronic components 6 are mounted and a second face 12 opposite to the first face 11. The first and second faces 11 and 12 each extend in a plane parallel to a plane comprising a first direction X and a second direction Y. The second face 12 of the substrate is insulated and assembled to the cooling system 3 by bonding using a thermally conductive adhesive 7 for example. The second face 12 of the substrate could also be assembled to the cooling system 3 by mechanical assembly. The cooling system 3 can be formed by a heat sink.

In the embodiment illustrated in FIG. 1, the substrate 10 comprises four conductive layers 13 to 16 made of electrically and thermally conductive material and three insulating layers 17 to 19 made of electrically insulating material. The conductive layers 13 to 16 and the insulating layers 17 to 19 are stacked alternately in a third direction Z orthogonal to the first and second directions X and Y, so as to obtain a successive stack of conductive layers separated by insulating layers.

In other words, the stack of layers comprises a conductive layer 16 on which at least one superimposition formed of an insulating layer 19 and a conductive layer 15 are then stacked, two successive conductive layers being separated by an insulating layer. In the embodiment illustrated in FIG. 1, the stack forming the substrate 10 is formed of a conductive layer 16 on which are successively stacked three superimpositions formed of an insulating layer, respectively 19, 18 and 17, and of a conductive layer, respectively, 15, 14 and 13.

Each conductive layer 13, 14, 15 and 16 comprises a first face, respectively referenced 130, 140, 150 and 160, and a second face, respectively referenced 135, 145, 155 and 165, each extending in a plane parallel to the plane XY comprising the first and second directions X and Y.

The first face 130 of the first conductive layer 13 forms the first face 11 of the substrate 10 of the electric power circuit 4 on which the electronic components 6 are mounted. The second face 135 of the first conductive layer 13 is disposed facing the first face 140 of the second conductive layer 14, the second face 135 of the first conductive layer 13 being separated from the first face 140 of the second conductive layer 14 by the first insulating layer 17. The second face 145 of the second conductive layer 14 is facing the first face 150 of the third conductive layer 15, the second face 145 of the second conductive layer 14 being separated from the first face 150 of the third conductive layer 15 by the second insulating layer 18. The second face 155 of the third conductive layer 15 is facing the first face 160 of the fourth conductive layer 16, the second face 155 of the third conductive layer 15 and being separated from the first face 160 of the fourth conductive layer 16 by the third insulating layer 19. The second face 165 of the fourth conductive layer 16 forms the second face 12 of the substrate 10.

In the embodiment illustrated in FIG. 1, each conductive layer 13 to 16 comprises three passages denoted respectively 132, 133, 134, 141, 143, 144, 151, 152, 154, and 161, 162 and 163 and each insulating layer 17 to 19 comprises four passages denoted respectively 171 to 174, 81 to 184 and 191 to 194.

The first conductive layer 13 further comprises a boss 136 extending in the third direction Z from the second face 135 of the first conductive layer 13 towards the heat sink of the cooling system 3, i.e. towards the second face 12 of the substrate 10. The boss 136 of the first conductive layer 13 passes through the first passage 171 of the first insulating layer 17, the first passage 141 of the second conductive layer 14, the first passage 181 of the second insulating layer 18, the first passage 151 of the third conductive layer 15, the first passage 191 of the third insulating layer 19, and the first passage 161 of the fourth conductive layer 16. The boss 136 of the first conductive layer 13 thus opens out onto the second face 12 of the substrate 10 by passing through the other layers 14 to 16 and 17 to 19 of the substrate to be directly in contact with the cooling system 3.

The second conductive layer 14 further comprises a first boss 146 extending in the third direction Z from the second face 145 of the second conductive layer 14 towards the heat sink of the cooling system 3, i.e. towards the second face 12 of the substrate 10. The first boss 146 of the second conductive layer 14 passes through the second passage 182 of the second insulating layer 18, the second passage 152 of the third conductive layer 15, the second passage 192 of the third insulating layer 19, and the second passage 162 of the fourth conductive layer 16. The first boss 146 of the second conductive layer 14 thus opens out onto the second face 12 of the substrate 10 by passing through the other layers 15, 16, 18 and 19 of the substrate 10 to be directly in contact with the cooling system 3.

The second conductive layer 14 also comprises a second boss 147 extending in the third direction Z from the first face 140 of the second conductive layer 14 towards the electronic components 6, i.e. towards the first face 11 of the substrate 10. The second boss 147 of the second conductive layer 14 passes through the second passage 172 of the first insulating layer 17 and the first passage 132 of the first conductive layer 13. The second boss 147 of the second conductive layer 14 thus opens out onto the first face 11 of the substrate 10 by passing through the first insulating layer 16 and the first conductive layer 13 of the substrate 10 in order to be able to be electrically connected to an electronic component 6.

The third conductive layer 15 comprises a first boss 156 extending in the third direction Z from the second face 155 of the third conductive layer 15 towards the heat sink of the cooling system 3, i.e. towards the second face 12 of the substrate 10. The first boss 156 of the third conductive layer 15 passes through the third passage 193 of the third insulating layer 19 and the third passage 163 of the fourth conductive layer 16. The first boss 156 of the third conductive layer 15 thus opens out onto the second face 12 of the substrate 10 by passing through the third insulating layer 19 and the fourth conductive layer 16 of the substrate 10 to be directly in contact with the cooling system 3.

The third conductive layer 15 also comprises a second boss 157 extending in the third direction Z from the first face 150 of the third conductive layer 15 towards the electronic components 6, i.e. towards the first face 11 of the substrate 10. The second boss 157 of the third conductive layer 15 passes through the third passage 183 of the second insulating layer 18, the second passage 143 of the second conductive layer 14, the third passage 173 of the first insulating layer 17 and the second passage 133 of the first conductive layer 13. The second boss 157 of the third conductive layer 15 thus opens out onto the first face 11 of the substrate 10 by passing through the other layers 13, 14, 17 and 18 of the substrate 10 in order to be able to be electrically connected to an electronic component 6.

The fourth conductive layer 16 comprises a boss 167 extending in the third direction Z from the first face 160 of the fourth conductive layer 16 towards the electronic components 6, i.e. towards the first face 11 of the substrate 10. The boss 167 of the fourth conductive layer 16 passes through the fourth passage 194 of the third insulating layer 19, the third passage 154 of the third conductive layer 15, the fourth passage 184 of the second insulating layer 18, the third passage 144 of the second conductive layer 14, the fourth passage 174 of the first insulating layer 17 and the third passage 134 of the first conductive layer 13. The boss 167 of the fourth conductive layer 16 thus opens out onto the first face 11 of the substrate 10 by passing through the other layers 13, 14, 15, 17, 18 and 19 of the substrate 10 to be able to be electrically connected to an electronic component 6.

Figure 2:
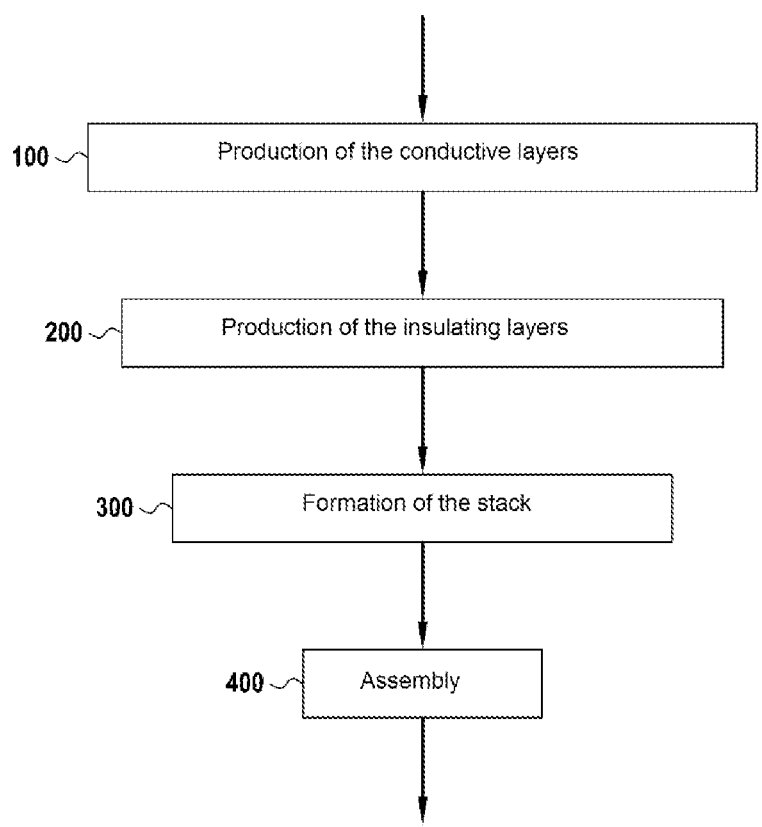
FIG. 2 represents a flowchart of a method for manufacturing an electric circuit of FIG. 1 according to one mode of implementation of the invention.

FIG. 2 illustrates a flowchart of a method for manufacturing a substrate 10 of an electric power circuit 5 of the converter 4 of FIG. 1 according to one mode of implementation of the invention.

In a first step 100, four conductive layers 13 to 16 are produced from four copper plates each initial thickness of which corresponds to the thickness of the substrate 10.

In this mode of implementation, each conductive layer 13 to 16 is produced by machining a copper plate through chemical treatment by forming bosses on one or two of the faces of the conductive layer.

In a second step 200, three insulating layers 17 to 19 made of electrically insulating material are produced from three plates made of insulating material used in the manufacture of the printed circuits, such as for example prepregs, FR4 or polyimide, in which orifices are drilled to allow the passage of the different bosses of the conductive plates.

In a third step 300, a stack is formed from the conductive and insulating layers, by alternately superimposing a conductive layer with an insulating layer, the stack having a first side 11 and a second side face 12 each formed by a conductive layer.

In a fourth step 400, all the conductive and insulating layers of the stack are mechanically assembled together. This assembly is made by bonding or by lamination of the assembly, i.e. a pressurization of the assembly under temperature, the objective being a polymerization of materials of the prepreg type used for the insulating layers.

The invention thus allows manufacturing an electric power circuit of an electric power converter for a control unit of at least one rotating machine whose space requirement is reduced while having optimum cooling and conversion performance, the electric circuit being able to be used for any electric power to be converted.

The invention claimed is:

1. An electric power circuit for an electric power converter, the circuit comprising a substrate having a first face on which electronic power components are mounted and a second face opposite to the first face and intended to cooperate with a cooling system,
wherein the substrate comprises a stack of a plurality of conductive layers made of electrically and thermally conductive material and at least one insulating layer made of electrically insulating material, two successive conductive layers in the stack being separated by an insulating layer, and said conductive and insulating layers extending in planes parallel to the plane in which the first face of the substrate extends and being mechanically associated together, and in that each conductive layer has two opposite faces parallel to the plane in which the first face of the substrate extends and includes, on at least one of its two faces, at least one electrically conductive boss extending from said face only in a direction perpendicular to the plane in which the first face of the substrate extends, said at least one electrically conductive boss extending through a passage passing through at least one other conductive layer and opening out onto the first or the second face of the substrate, the passage being wider than the electrically conductive boss in a direction parallel to the plane in which the first face of the substrate extends.

2. The circuit according to claim 1, wherein said at least one boss of a conductive layer is made in one piece with the conductive layer from which it extends.

3. The circuit according to claim 1, wherein said at least one boss of a conductive layer is transferred and fixed on the conductive layer from which it extends.

4. The circuit according to claim 1, wherein said at least one boss of a conductive layer is an electrically conductive part forcibly inserted into an opening of said conductive layer thus forming, in the direction perpendicular to the plane in which the first face extends, a first boss extending from the first face and a second boss extending from the second face of the substrate.

5. A control unit comprising a system for filtering a supply voltage, an electric power converter and a system for cooling the calories dissipated by the electronic components of said unit, wherein the electric power converter comprises an electric power circuit according to claim 1, the second face of the substrate of said circuit being in thermal contact with said cooling system.

6. A method for manufacturing an electric power circuit for an electric power converter comprising a substrate having a first face on which electronic power components are mounted and a second face opposite to the first face and intended to cooperate with a cooling system,
wherein the method comprises:
a step of producing at least two conductive layers made of electrically and thermally conductive material,
a step of producing at least one insulating layer made of electrically insulating material,
a step of forming a stack of at least two conductive layers and at least one insulating layer, two successive conductive layers in the stack being separated by an insulating layer, and said conductive and insulating layers extending in planes parallel to the plane in which the first face of the substrate extends and being mechanically associated together, and
a mechanical securing step to mechanically assemble together said conductive and insulating layers,
each conductive layer having two opposite faces parallel to the plane in which the first face of the substrate extends and including, on at least one of its two faces, at least one electrically conductive boss extending from said face only in a direction perpendicular to the plane in which the first face of the substrate extends, said at least one electrically conductive boss extending through a passage passing through at least one other conductive layer and opening out onto the first or the second face of the substrate, the passage being wider than the electrically conductive boss in a direction parallel to the plane in which the first face of the substrate extends.

7. The method according to claim 6, wherein the step of producing at least two conductive layers comprises, for each conductive layer, a mechanical or chemical machining of a plate of electrically and thermally conductive material whose thickness before machining is at least equal to the sum of the thickness of the layer after machining with the dimension of the largest boss extending from a first face of said conductive layer and, if the conductive layer comprises bosses on two opposite faces, with the dimension of the largest boss extending from a second face of said conductive layer opposite to said first layer.

8. The method according to claim 6, wherein the step of producing at least two conductive layers comprises a formation of said at least one boss by stamping or machining of parts made of electrically and thermally conductive material then a transfer of said at least one boss thus formed on a plate of electrically and thermally conductive material to obtain a conductive layer provided with bosses.

9. The method according to claim 8, wherein the transfer of said at least one boss includes a bonding of said boss using an electrically and thermally conductive adhesive, or a soldering of said boss by means of an alloy delivery, or a sintering of said boss by means of a delivery of silver nanoparticles.

10. The method according to claim 6, wherein the step of producing at least two conductive layers comprises a production of each conductive layer provided with bosses in one piece by additive manufacturing.

11. The method according to claim 6, wherein the mechanical securing step comprises a bonding of said conductive and insulating layers or a prepreg lamination of said conductive and insulating layers.

\* \* \* \* \*